United States Patent
O'Toole et al.

(10) Patent No.: US 10,566,231 B2
(45) Date of Patent: Feb. 18, 2020

(54) INTERCONNECT FORMATION WITH CHAMFERLESS VIA, AND RELATED INTERCONNECT

(71) Applicant: GLOBALFOUNDRIES INC., Grand Cayman (KY)

(72) Inventors: Martin J. O'Toole, Saratoga Springs, NY (US); Christopher J. Penny, Saratoga Springs, NY (US); Jae O. Choo, Clifton Park, NY (US); Adam L. da Silva, Saratoga Springs, NY (US); Craig Child, Gansevoort, NY (US); Terry A. Spooner, Halfmoon, NY (US); Hsueh-Chung Chen, Cohoes, NY (US); Brendan O'Brien, Ballston Spa, NY (US); Keith P. Donegan, Saratoga Springs, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/966,032

(22) Filed: Apr. 30, 2018

(65) Prior Publication Data
US 2019/0333805 A1    Oct. 31, 2019

(51) Int. Cl.
*H01L 21/768* (2006.01)
*H01L 23/532* (2006.01)

(52) U.S. Cl.
CPC .. *H01L 21/76813* (2013.01); *H01L 21/76843* (2013.01); *H01L 23/53223* (2013.01); *H01L 23/53266* (2013.01)

(58) Field of Classification Search
None
See application file for complete search history.

(56) References Cited

U.S. PATENT DOCUMENTS

| | | | |
|---|---|---|---|
| 6,063,711 A | 5/2000 | Chao et al. | |
| 6,153,511 A * | 11/2000 | Watatani | H01L 21/02126 257/E21.26 |
| 2003/0199169 A1 | 10/2003 | Jun et al. | |
| 2007/0082477 A1 * | 4/2007 | Naik | H01L 21/76808 438/622 |
| 2014/0264895 A1 * | 9/2014 | Sung | H01L 21/76802 257/773 |

* cited by examiner

*Primary Examiner* — Chandra Chaudhari
(74) *Attorney, Agent, or Firm* — Anthony Canale; Hoffman Warnick LLC

(57) ABSTRACT

Methods of forming an interconnect of an IC are disclosed. The methods include forming a first interlayer dielectric (ILD) layer and a second ILD layer with an ILD etch stop layer (ESL) therebetween. The ILD ESL has an etch rate that is at least five times slower than the first and second ILD layers, and may include, for example, aluminum oxynitride. A dual damascene (DD) hard mask is used to form a wire trench opening in the second ILD layer and a via opening in the first ILD layer, creating a via-wire opening. Due to the slower etch rate, the ILD ESL defines the via opening in the first ILD layer as a chamferless via opening. A unitary via-wire conductive structure coupled to the conductive structure in the via-wire opening can be formed from the via-wire opening.

14 Claims, 5 Drawing Sheets

INTERCONNECT FORMATION WITH CHAMFERLESS VIA, AND RELATED INTERCONNECT

BACKGROUND

The present disclosure relates to integrated circuit (IC) interconnects, and more specifically, to methods of forming an interconnect with a chamferless via, and a related interconnect.

Integrated circuits include a number of interconnect layers that allow for electrical interconnection of devices in various layers such as transistors, resistors, capacitors, etc. Each interconnect layer typically includes wiring that laterally interconnects structures, or vias that vertically interconnect structures. Each interconnect layer typically includes a dielectric layer into which the wires and/or vias, which are collectively and individually referred to herein as interconnects, are formed. Each interconnect layer is typically separated by an etch stop layer that is used to control etching during formation of the interconnect layers.

Damascene is a process in which an interconnect pattern is first lithographically defined in a layer of dielectric, then metal is deposited to fill resulting wire trench openings or via openings, and then excess metal is removed by means of chemical-mechanical polishing (planarization). Dual damascene is a similar process in which interconnect patterns define wire trench openings and via openings together prior to metal deposition.

During dual damascene processing, a via preferably lands on a via or another conductive structure, e.g., a wire or device, in a lower interconnect layer. A challenge with this process is that the trench etching to create a wire trench opening for a wire can impact aspects of the via opening for the via, and hence the operation of the via. First, an enlarged chamfer can be created during trench etching that can cause a short of the via. The ability for an enlarged chamfer to create a short can be increased, for example: by an overlay error (OVL) in the mask patterning for via(s) and/or wire(s); a non-uniformity or an angle variation of the via(s); and/or a high voltage strip fail. Second, the trench etching coming after the via etching can create a via bumpout that when filled with metal can short the via to, for example, another wire above the via. In particular, the trench etching can erode the metal liner that can allow for the short. Even if a short does not immediately result, the occurrence of shorts can still be increased because of the increased chances of time dependent dielectric breakdown (TDDB) caused by the overlay error or liner erosion. These challenges may be more profound, for example, near a wafer edge when process non-uniformity (e.g., film thickness, etch rate) occurs. The issue may occur, for example, due to increased etch stop layer erosion during dielectric reactive ion etching (RIE) at the edge. However, the challenges can be observed in any interconnect layer.

SUMMARY

A first aspect of the disclosure is directed to a method of forming an interconnect for an integrated circuit (IC), the method comprising: forming an interlayer dielectric etch stop layer (ILD ESL) extending between a first interlayer dielectric (ILD) layer and a second ILD layer, wherein the ILD ESL has an etch rate that is at least five times slower than the first ILD layer and the second ILD layer; and forming a unitary via-wire conductive structure having a chamferless via portion thereof in the first ILD layer and a wire trench portion thereof in the second ILD layer over the first ILD layer, and wherein the chamferless via portion extends through the ILD ESL.

A second aspect of the disclosure includes a method of forming an interconnect of an integrated circuit (IC), the method comprising: forming a first interlayer dielectric (ILD) layer over an interconnect layer, the interconnect layer including a conductive structure therein under an interconnect layer etch stop layer (ESL); forming an aluminum oxynitride (AlON) etch stop layer (ESL) over the first ILD layer; forming a second interlayer dielectric (ILD) layer over the AlON ESL; forming a dual damascene (DD) hard mask over the second ILD layer, the DD hard mask including: a patterned wire trench hard mask layer over the second ILD layer, a mask barrier layer over the patterned wire trench hard mask layer, and a patterned via opening hard mask layer over the mask barrier layer; etching a preliminary via opening through the mask barrier layer, the patterned hard mask layer and the second ILD layer to the AlON ESL; removing the AlON ESL at a bottom of the preliminary via opening, creating a via ESL opening in the AlON ESL; removing the mask barrier layer, exposing the patterned wire trench hard mask layer; etching to form a wire trench opening in the second ILD layer and a via opening in the first ILD layer, wherein the via ESL opening in the AlON ESL defines the via opening in the first ILD layer as a chamferless via opening; removing any remaining interconnect layer ESL in the via opening to expose an upper surface of the conductive structure in the interconnect layer; and forming a unitary via-wire conductive structure coupled to the conductive structure in the via-wire opening.

A third aspect of the disclosure related to an interconnect for an integrated circuit (IC), the interconnect comprising: a unitary via-wire conductive structure having a chamferless via portion thereof in a first interlayer dielectric (ILD) layer and a wire trench portion thereof in a second ILD layer over the first ILD layer; and an ILD etch stop layer (ESL) extending between the first ILD layer and the second ILD layer, wherein the ILD ESL has an etch rate that is at least five times slower than the first ILD layer and the second ILD layer, and wherein the chamferless via portion extends through the ILD ESL.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide methods of forming an interconnect for an IC. The methods employ an etch stop layer (ESL) between a metal layer interlayer dielectric (ILD) layer and a via layer ILD layer, rather than having a single layer of ILD. The ESL has an etch rate that is at least five times slower than the ILD layers. In one embodiment, the ESL includes aluminum oxynitride (AlON). During dual damascene etching of a wire trench opening and a via opening in the ILD layers, the ESL retains the via opening without a chamfer. The methods enable, among other things, a chamferless via formation and dual damascene profile control.

Figure 1:
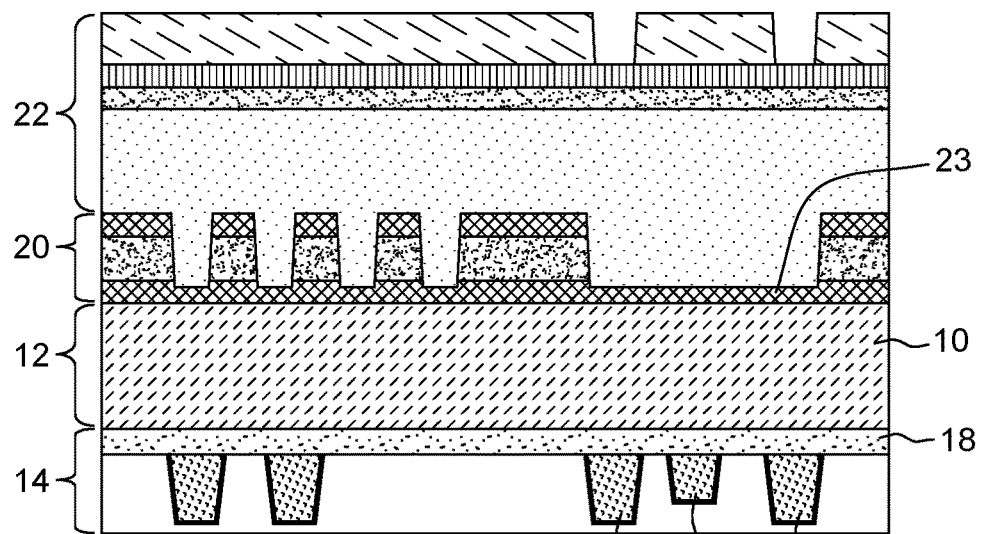
FIGS. 1-3 show cross-sectional views of a conventional process of forming an interconnect including a via-wire conductive structure.
Figure 2:
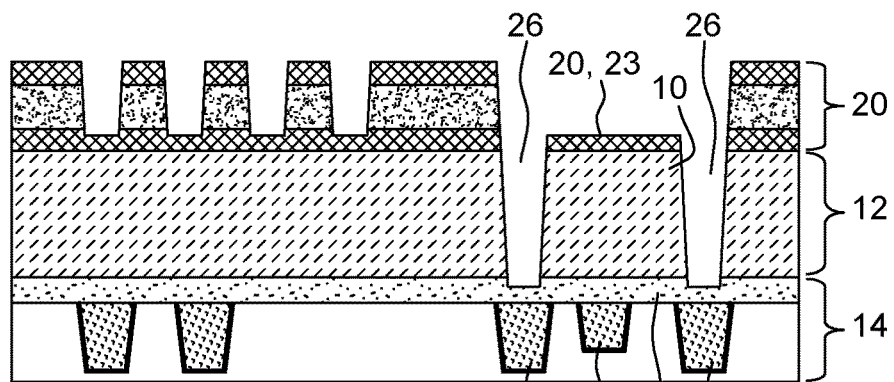
Figure 3:
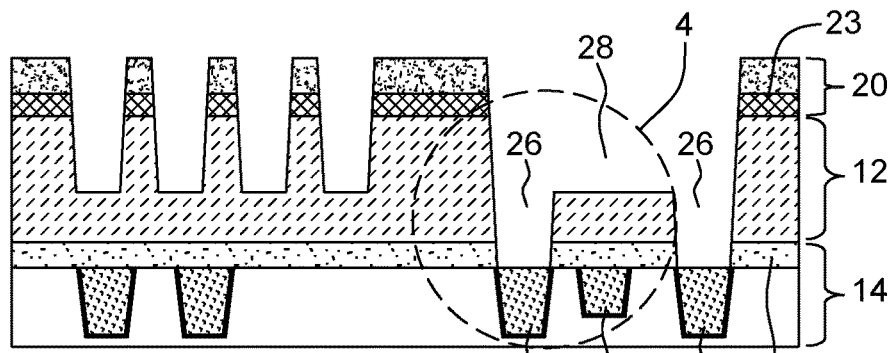

FIGS. 1-3 show cross-sectional views of a conventional dual damascene process for forming a via-wire conductive structure in a dielectric layer 10 of an interconnect layer 12. Interconnect layer 12 is positioned over a lower interconnect layer 14 including, as shown in FIG. 1, a number of vias 16 and a wire 17. Interconnect layers 12, 14 are separated by etch stop layer 18, e.g., of silicon nitride. In this example, a dual damascene process for creating via-wire structure in interconnect layer 10 includes forming a hard mask 20 over dielectric layer 10 including a wire trench pattern therein, then forming a via mask 22 having a via opening pattern therein over hard mask 20. Hard mask 20 typically includes an etch stop layer 23, e.g., of titanium nitride. As shown in FIG. 2, an etching is then carried out to etch via openings 26 for vias into dielectric layer 10. At this stage, via openings 26 expose etch stop layer 18. As shown in FIG. 3, the via etching is followed by a wire trench etching to etch wire trench opening 28 for a wire (wire will couple vias formed in via openings 26). Each etching may include, for example, a reactive ion etch (RIE).

Figure 4:
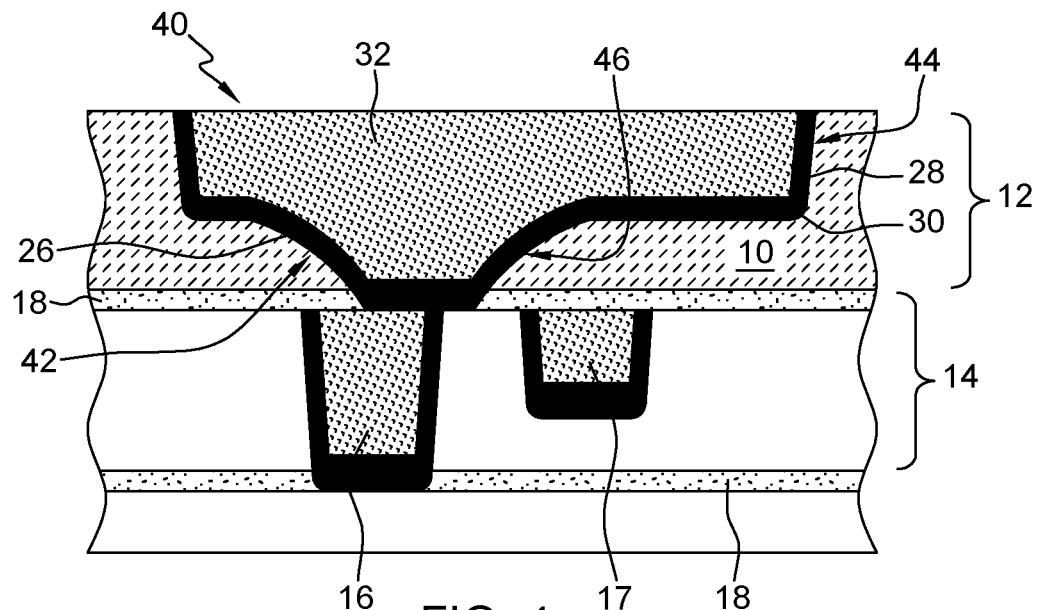
FIG. 4 shows an enlarged cross-sectional view of the via-wire conductive structure formed by the processes of FIGS. 1-3.

FIG. 4 shows an enlarged cross-sectional view of a portion of FIG. 3 after metal has been deposited in openings 26, 28. More particularly, after etch stop layer 18 is removed, conventional processing continues with a barrier liner 30 (e.g., refractory metal) deposition into via opening 26 and wire opening 28, then a metal 32 (e.g., copper) deposition and a planarization to create a via-wire conductive structure 40 including a via 42 and a wire 44. Via 44 preferably lands on via 16 or another conductive structure, e.g., a wire or device, in lower interconnect layer 14.

Figure 5:
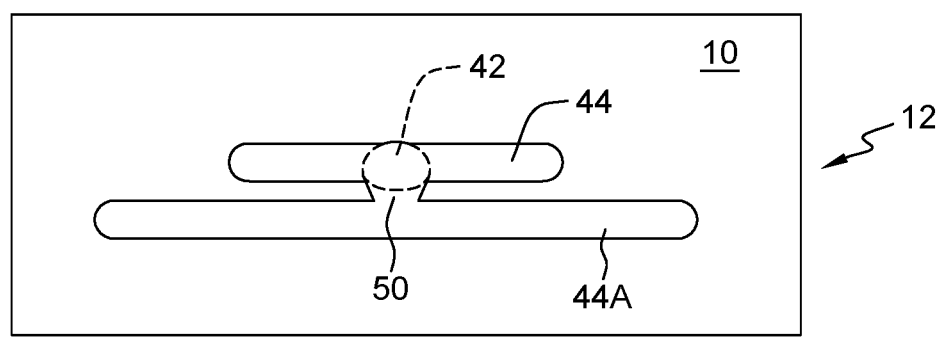
FIG. 5 shows a plan view of the via-wire conductive structure formed by the processes of FIGS. 1-3.

As noted, a challenge with this process is that the trench etching (FIG. 2) to create wire trench opening 28 for wire 44 can impact aspects of via opening 26 for via 42, and hence the operation of via 42. First, as shown in FIG. 4, an enlarged chamfer 46 can be created during trench etching (FIG. 3) that can cause a short of via 42 to, for example, wire 17 therebelow (or another via in the same location as wire 17). The ability for enlarged chamfer 46 to create a short can be increased, for example: by an overlay error (OVL) in the mask patterning for via 42, via 16, wire 44 and/or wire 17; a non-uniformity or an angle variation of via 42 and/or via 16; and/or a high voltage strip fail. Second, as shown in a plan view in FIG. 5, the trench etching coming after via etching can create a via bumpout 50 that when filled with metal can short via 42 (shown in phantom under wire 44) to, for example, another wire 44A above via 42. In particular, the trench etching can erode metal liner 30 (FIG. 4) that can allow for the short. Even if a short does not immediately result, the occurrence of shorts can still be increased because of the increased chances of time dependent dielectric breakdown (TDDB) caused by the overlay error or liner erosion. These challenges may be more profound near a wafer edge due to increased etch stop layer erosion during dielectric reactive ion etching (RIE) at the edge, but they can be observed in any interconnect layer.

Figure 6:
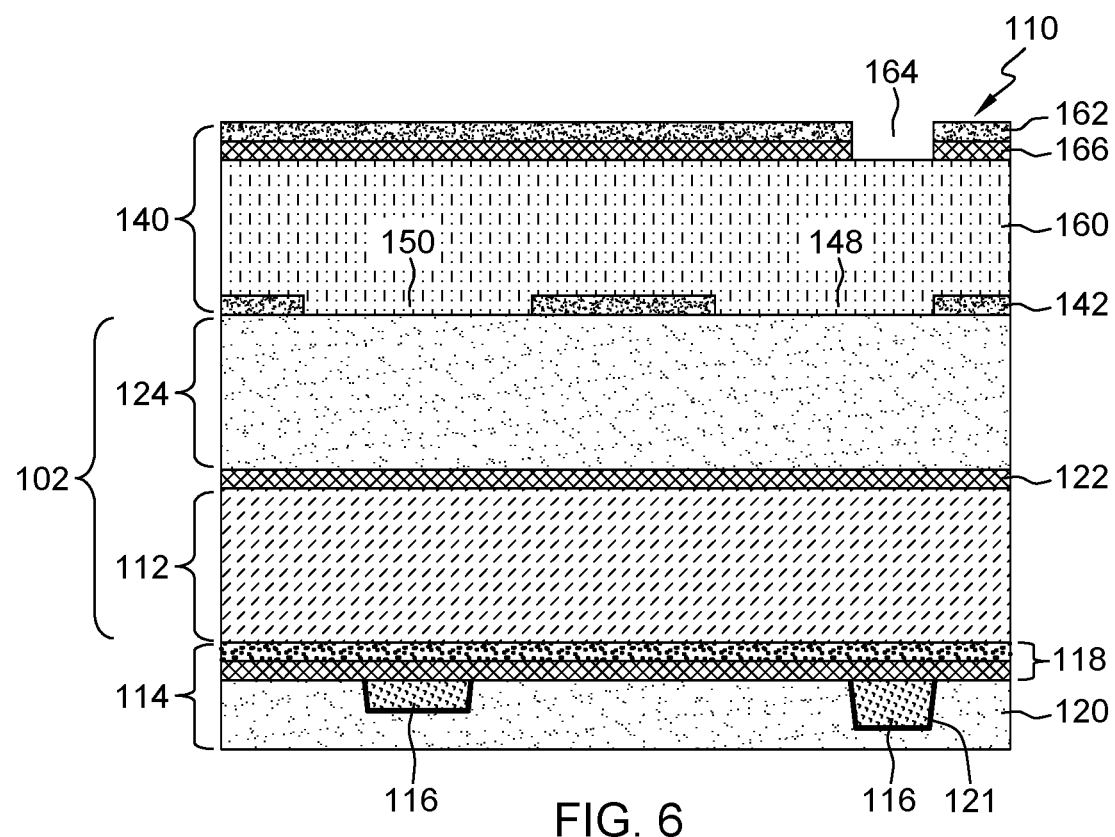
FIGS. 6-11 show cross-sectional views of a method of forming an interconnect according to embodiments of the disclosure, with FIG. 11 showing an embodiment of the interconnect.

Referring to FIGS. 6-11, cross-sectional views of methods of forming an interconnect 100 (FIG. 11) for an integrated circuit (IC) according to one embodiment of the disclosure will now be described. FIG. 6 shows, inter alia, forming an etch stop layer (ESL) 122 extending between a first interlayer dielectric (ILD) layer 112 and a second ILD layer 124. As will be described, ILD ESL 122 has an etch rate that is at least five times slower than the first ILD layer and the second ILD layer. Interconnect 100 may be in any back end of line (BEOL) layer of an IC. As understood in the art, BEOL indicates any IC fabrication processes performed on the semiconductor wafer in the course of device manufacturing following first metallization.

Figure 8:
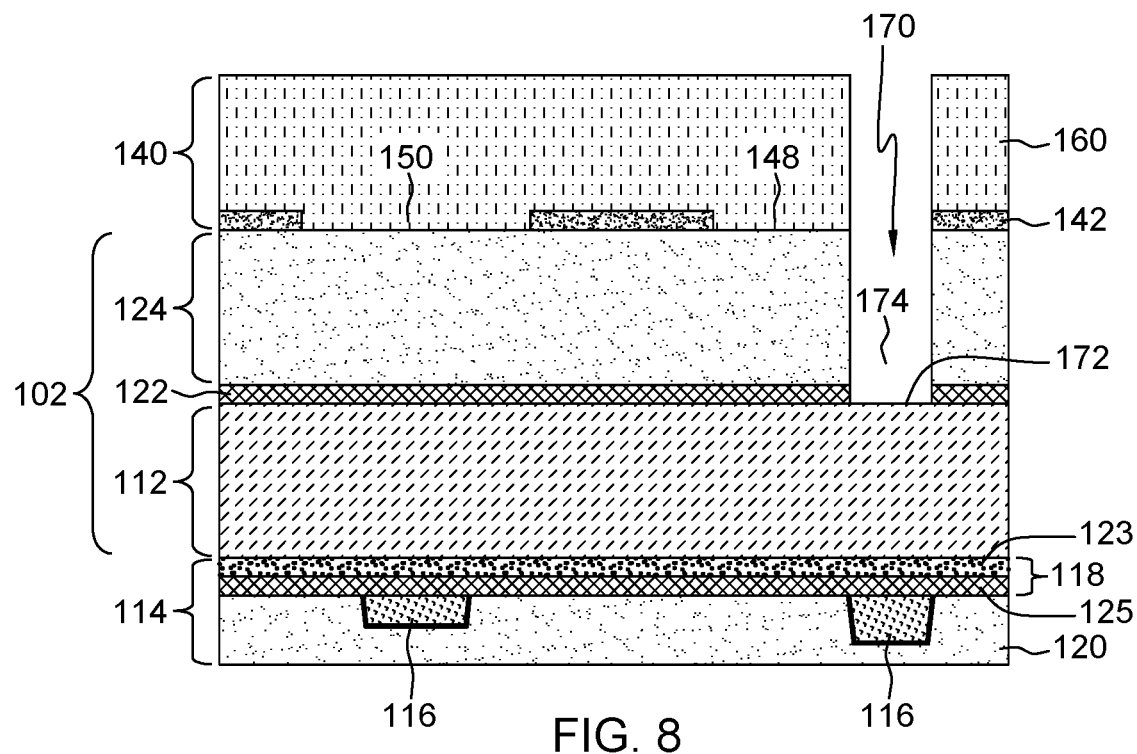

FIG. 6 shows a number of steps. FIG. 6 shows forming first ILD layer 112 over an interconnect layer 114. Interconnect layer 114 includes any number of conductive structures 116 therein under an interconnect layer etch stop layer (ESL) 118. Conductive structures 116 in interconnect layer 114 may include wires, vias and/or via-wires (shown as vias), each with a conductor within a barrier liner. However, conductive structures 116 may include any now known or later developed BEOL structure: other interconnects, and/or passive devices such as resistors or capacitors, etc. Conductive structure(s) 116 are positioned in an ILD layer 120, perhaps with a refractory metal liner 121 thereabout. Interconnect layer ESL 118 may include a number of layers, for example, an oxygen-doped silicon carbide (SiC:O) layer or a nitrogen-doped silicon carbide (SiC:N) layer (FIG. 8) 123, over an aluminum oxynitride (AlON) layer 125 (FIG. 8). Other ESLs may be employed in addition to these layers or in replacement thereof.

FIG. 6 also shows forming an etch stop layer (ESL) 122 over first ILD layer 112, and forming a second ILD layer 124 over ESL 122. Each ILD layer 112, 120, 122 may include but are not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), octamethylcyclotetrasiloxane (OMCTS) and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning). In one embodiment, first ILD layer 112 may include OMCTS 2.7, and second ILD layer 124 may include OMCTS 2.4. It is understood that "2.7" and "2.4" indicate the dielectric constant (k) of the materials. Each layer is considered to be low-k, i.e., with a k value of less than 3.0. Interconnect layer ILD layer 120 may include any of the afore-listed materials. Such materials may be selected to provide improved etch selectivity with the ESLs described herein.

ESL 122 shall be referred to herein "ILD" ESL 122 because of its location between first and second ILD layers 112, 124, and to differentiate from other ESLs, described herein. While not shown, it is understood that other layers may also be present above or below ILD ESL 122, e.g., other ESL layers. In accordance with embodiments of the disclosure, for purposes to be described herein, ILD ESL 122 has an etch rate that is at least five times slower than first ILD layer 112 and second ILD layer 124. In one embodiment, ILD ESL 122 may include, for example, aluminum oxynitride (AlON), aluminum nitride (AlN), aluminum oxide (AlxOy), titanium oxide (TiOx). In any event, ILD ESL 122 is relatively thin, e.g., less than 5 nanometers. These materials and thicknesses are in contrast to predecessor processes that employ different materials and are much thicker. In particular, as will be described, etch chemistries are much different for the low-k materials and the ESLs employed herein, which can use chlorine-based chemistries to etch which increases selectivity.

ILD layer 112, 120, 124 and ILD ESL 122 may be formed using any now known or later developed process appropriate for the materials. For example, each layer may be deposited. "Depositing" may include any now known or later developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 10:
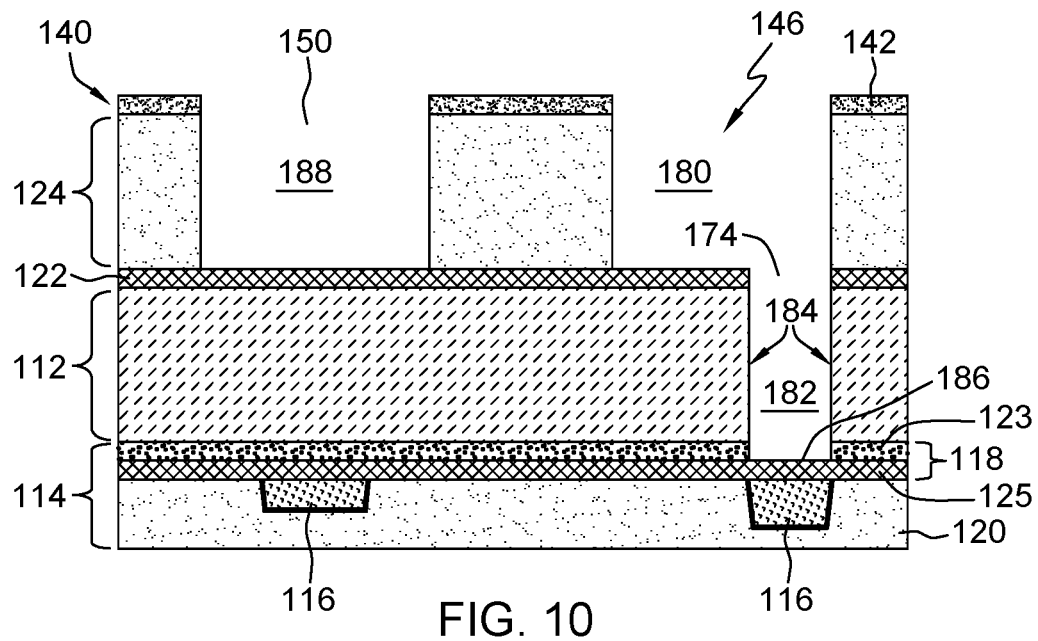

FIG. 6 also shows forming a dual damascene (DD) hard mask 140 over second ILD layer 124. DD hard mask 140 may include any now known or later developed DD hard mask 140 for creating a via-wire opening 146 (FIG. 10). For example, DD hard mask 140 may include any now known or later developed hard mask stack, and may be configured as a multi-color hard mask, i.e., capable of creating openings in a variety of different locations and orientations. In one embodiment, DD hard mask 140 may include a patterned wire trench hard mask layer 142 over second ILD layer 124. Patterned wire trench hard mask layer 142 may include any desired wire trench mask openings 148, 150 for forming a wire(s) (not shown) in second ILD layer 124. As shown, patterned wire trench hard mask layer 142 includes two wire trench mask openings 148, 150; however, any number may be provided. It is noted that the sizes of openings 148, 150 may vary, and no accuracy should be attributed to the relative sizes shown. Wire trench mask opening 148 will eventually create part of via-wire opening 146 (FIG. 10). Patterned wire trench hard mask layer 142 may include any now known or later developed hard mask material such as but not limited to titanium nitride (TiN). DD hard mask 140 may also include a mask barrier layer 160 over patterned wire trench hard mask layer 142. Mask barrier layer 160 may include any now known or later developed material for a spin-on hard mask (SOH) layer such as silicon SOH, carbon SOH, and/or an optical planarization layer (OPL).

DD hard mask 140 may also include a patterned via opening hard mask layer 162 over mask barrier layer 160. Patterned via opening hard mask layer 162 may include any number of a via mask openings 164 that define where via opening 182 (FIG. 10) of via-wire opening 146 (FIG. 10) will be formed in first ILD 112. Patterned via opening hard mask layer 162 may include any now known or later developed via mask such as but not limited to: tetraethyl orthosilicate $Si(OC_2H_5)_4$ (TEOS), low temperature oxide (LTO) or silicon nitride ($Si_3N_4$). Via mask opening 164 is positioned over wire trench opening 148, but not over wire trench opening 150. DD hard mask 140 may also optionally include a patterned, mask etch stop layer (ESL) 166 over mask barrier layer 160 and under patterned via trench hard mask layer 162. Patterned, mask ESL 166 may have the same pattern as pattern via opening hard mask layer 162. In one embodiment, patterned, mask ESL 166 may include aluminum oxynitride (AlON), titanium nitride (TiN), titanium oxide (TiOx), tantalum nitride (TaN), aluminum oxynitride (AlxOyNz) or a ceramic. While a particular hard mask stack has been described, any now known or later developed hard mask stack may be employed. Each patterned hard mask layer 142, 162, 166 may be formed using any now known or later developed hard mask formation techniques, e.g., deposition, lithographic exposure and development and etching to form the pattern therein.

Figure 7:
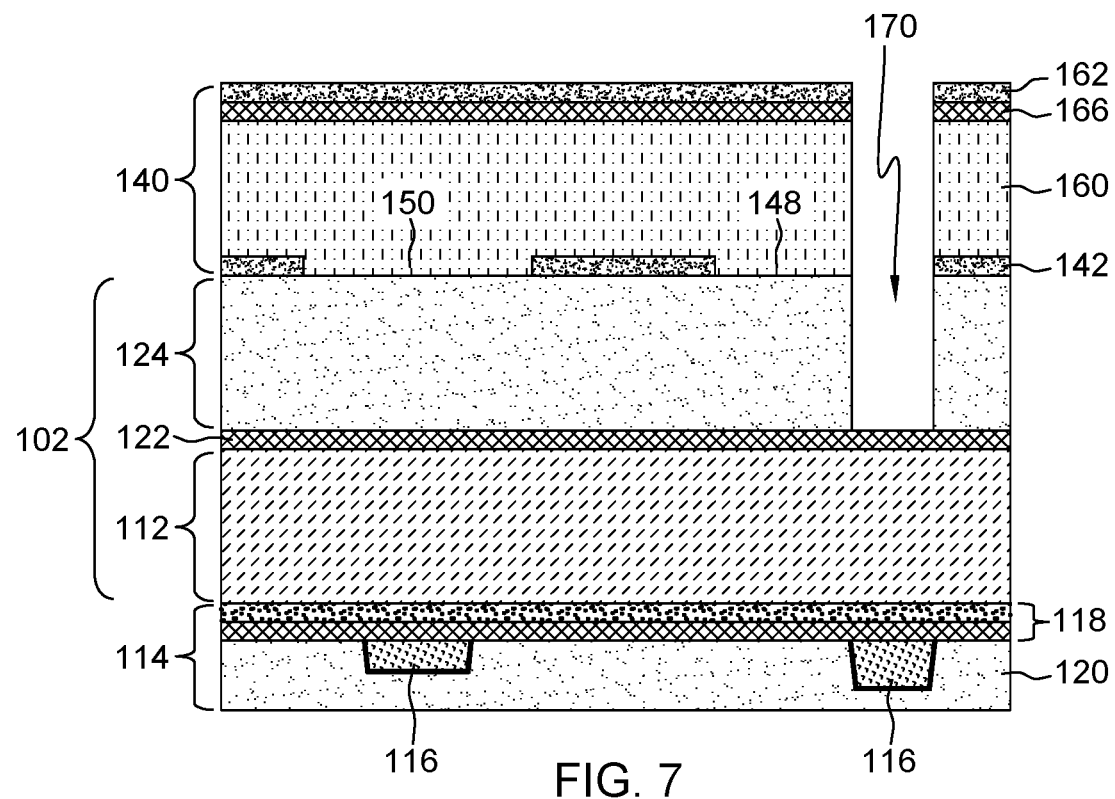

FIG. 7 shows etching a preliminary via opening 170 through second ILD layer 124 to ILD ESL 122 using DD hard mask 140. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. In this disclosure, chlorine-cased chemistry may be used to enhance selectivity to Si based (SiO2, SiN) materials. Remote plasma processing (e.g., SiConi) can be used for Si oxynitrides, nominally using hydro-fluoric acid (HF) chemistry. For AlON type ESL, chemistries such metal oxide solvents (peroxide based) may be used. In the instant case, for second ILD layer 124 to ILD ESL 122 using DD hard mask 140, the etching may include any etching process appropriate for mask barrier layer 160 and second ILD layer 124 such as but not limited to: a RIE process such as a carbon monoxide/carbon dioxide (CO/CO2) or nitrogen/hydrogen (N/H) type process for mask barrier layer 160, and a fluorine (F) based dielectric etch for second ILD layer 124. The etching may remove part of hard mask 140, e.g., part of layer 162. Preliminary via opening 170 is termed "preliminary" because, as will be described, it is further etched to form via-wire opening 146 (FIG. 10).

FIG. 8 shows removing ILD ESL 122 at a bottom 172 of preliminary via opening 170, creating a via ESL opening 174 through ILD ESL 122. ILD ESL 122 can be removed from bottom 174 using a RIE or wet clean such as an argon (Ar) sputter, a chlorine based chemistry, or a flourine (F) based process (the latter for, e.g., titanium oxide (TiOx)), where appropriate. The use of such chemistries with the low-k materials of ILDs 112, 124 and the materials of ILD ESL 112 (e.g., AlON) provides for increased etch selectivity compared to conventional processes. Other wet chemistries that can be used include mixtures of an etchant source, corrosion inhibitor, metal chelating agent and passivation agent, where the etchant source is fluoro or ammonium based salt(s).

Figure 9:
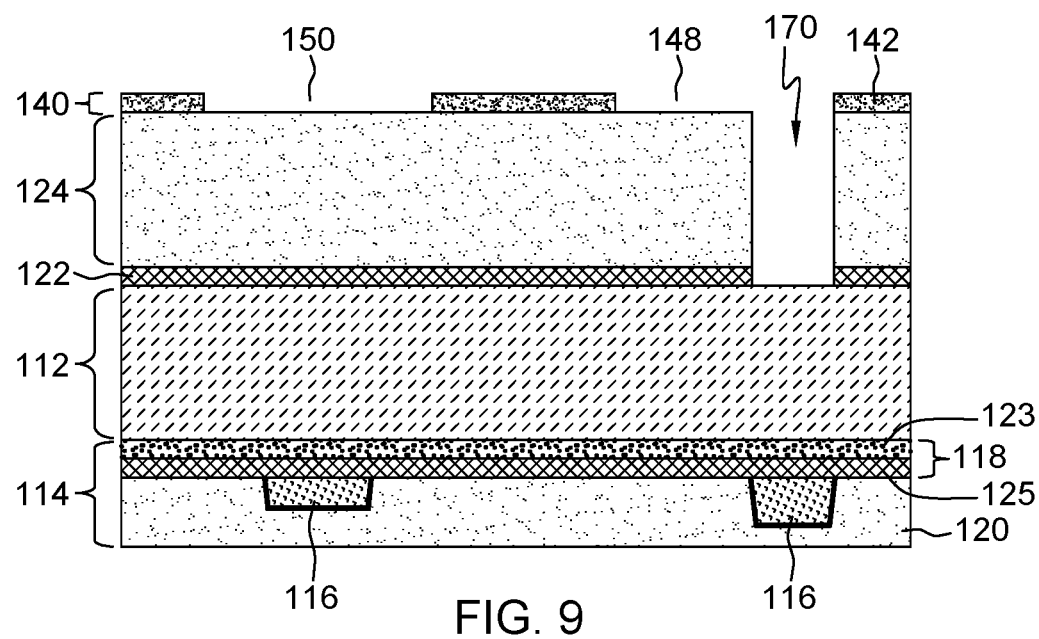

FIG. 9 shows optionally removing mask barrier layer 160 (FIG. 8), i.e., before etching via-wire opening 146. This process exposes patterned wire trench hard mask layer 142. This etching may include, for example, a RIE process such as a carbon monoxide/carbon dioxide ($CO/CO_2$) or nitrogen/hydrogen (N/H) type process.

FIG. 10 shows etching to form a wire trench opening 180 in second ILD layer 124 and a via opening 182 in first ILD layer 112, creating via-wire opening 146. Via-wire opening 146 includes wire trench opening 180 coupled to via opening 182 to form a unitary opening. This etching may include any now known or later developed etching process appropriate for ILD layers 112, 114 such as a RIE. During this etching, via ESL opening 174 in ILD ESL 122 defines via opening 182 in first ILD layer 112 having a chamferless via opening portion 184. As used herein, "chamferless" indicates that the sides of the via opening are not angled outwardly sufficiently to allow for damage through electromigration or misalignment as described relative to the prior art, e.g., the sides are angled at no less than 75° relative to horizontal. In this manner, chamfer 42 (FIG. 4) and the related issues it creates can be avoided. This etching may also remove part of interconnect layer ESL 118, i.e., SiC:N or SiC:O layer 123, in a bottom 186 of via opening 182, exposing AlON layer 125. Where wire trench mask openings 150 are provided in wire trench hard mask layer 142, conventional wire openings 188 may be formed during this etching.

Figure 11:
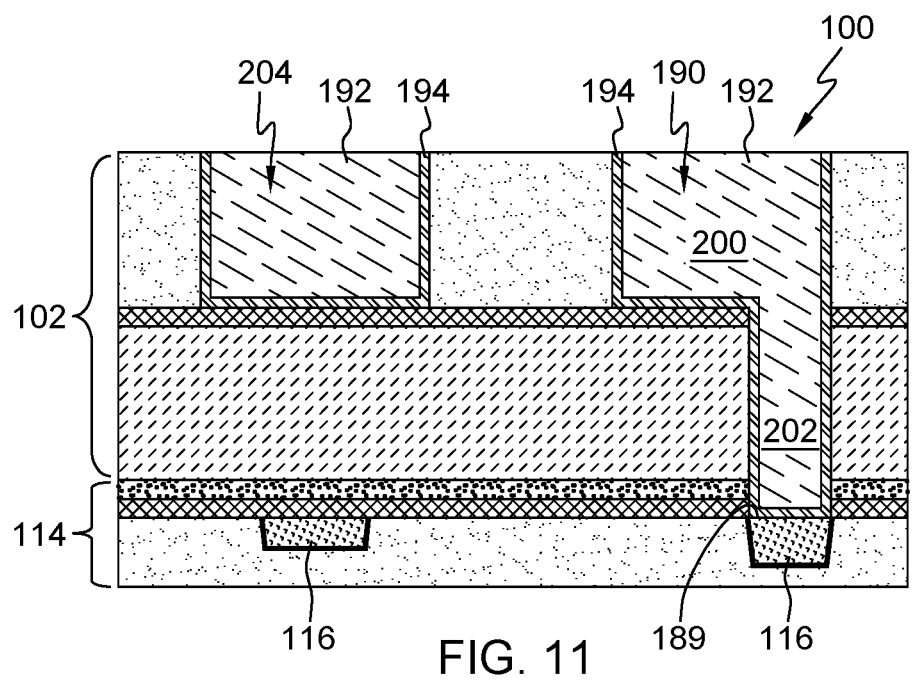

FIG. 11 shows removing any remaining interconnect layer ESL 118, e.g., by removing AlON layer 125 (FIG. 10), in bottom of via opening 182, exposing upper surface 189 of conductive structure 116. This step may include a RIE or a wet etch such as an argon (Ar) sputter, a chlorine based chemistry, or a flourine (F) based, where appropriate. The etch is performed prior to forming via-wire conductive structure 190. The wet etch could include application of an EKC post-etch residue remover, available from DuPont Chemical Co.

FIG. 11 also shows forming a unitary via-wire conductive structure 190 in via-wire opening 146 (FIG. 10). This process may include depositing a conductor 192 in via-wire opening 146 (FIG. 10). Conductor 192 may include any now known or later developed conductive material for an IC such as but not limited to: copper, aluminum, etc. As shown in FIG. 11, a barrier liner 194 deposition over via-wire opening 146 (FIG. 10) may precede conductor 192 deposition. Barrier liner 194 may include any now known or later developed barrier liner material (e.g., refractory metal liner) including but not limited to: tantalum nitride (TaN) and tantalum; tantalum nitride, tantalum and cobalt; and magnesium (Mn), or combinations thereof. Once complete, wire trench portion 200 is over via portion 202 of unitary via-wire conductive structure 190. Unitary via-wire conductive structure 190 is so termed because it does not include any other material layers between wire trench portion 200 and via portion 202 thereof, i.e., conductor 192 is one piece, integrally formed. Where wire opening(s) 188 (FIG. 10) are present, forming unitary via-wire conductive structure 190 may also include forming a wire conductive structure 204 in wire trench opening(s) 188 (FIG. 10) by depositing conductor 192 and barrier liner 194 in wire opening(s) 188. FIG. 11 also shows, after depositing conductor 192, planarizing to remove any remaining hard mask 140 (e.g., patterned wire trench hard mask layer 142), any remaining via mask (not shown) and excess conductor 192.

FIG. 11 shows interconnect 100 for an IC according to embodiments of the disclosure. Interconnect 100 may include unitary via-wire conductive structure 190 having a chamferless via portion 202 thereof in first ILD layer 112, and wire trench portion 200 thereof in second ILD layer 124 over first ILD layer 112. ILD etch stop layer 122 remains in interconnect 100. In particular, ILD ESL 122 extends between first ILD layer 112 and second ILD layer 124 (except where chamferless via portion 202 extends therethrough). As noted, ILD ESL 122 has an etch rate that is at least five times slower than first ILD layer 112 and second ILD layer 124. In one embodiment, ILD ESL 122 may include AlON. ILD ESL 122 has a thickness that may be less than 5 nanometers. Chamferless via portion 202 may operatively couple to conductive structure 116 in interconnect layer 114.

Unitary via-wire conductive structure 190 includes chamferless via portion 202 and wire trench portion 200 above the via portion. Chamferless via portion 202 is chamferless in first ILD layer 112 due the definition provide by ILD ESL 122 having a much slower etch rate (i.e., at least 5 times slower) compared to ILD layers 112, 124 during formation of via opening 182 (FIG. 10). There are no intervening material layers between via portion 202 and wire trench portion 200. While via portion 202 is shown including a single via, it is understood that it may include an number of vias extending from a lower portion of wire trench portion 200 to respective conductive structure(s) 116 in interconnect layer 114 therebelow. That is, it is recognized that more or less vias can be formed using the process described herein.

Interconnect 100 may also optionally include a wire conductive structure 204 in the same ILD layer 124 as wire portion 200 of unitary via-wire conductive structure 190. Although not necessary in all embodiments, in one embodiment, interconnect 100 may include interconnect layer ESL 118 (FIG. 10) between interconnect layer 114 and first ILD layer 112, the interconnect layer ESL including a layer 125 have the same etch rate as ILD ESL 122, e.g., AlON. Interconnect layer ESL 118 may further include SiC:N or SiC:O layer 123 over the AlON layer.

While a single unitary via-wire conductive structures 190 is shown formed by processes herein, it is understood that any number of them may be formed using the masks described herein.

Embodiments of the disclosure provide improved via profile and a chamferless via for unitary via-wire conductive structure, i.e., a dual damascene interconnect. The improved via profile can provide improved capacitance and better reliability relative to shorts and TDDB. Further, the improved via profile provides better parametric control, and can eliminate via bumpouts, and via gouging or fanging. The methods may also provide better overlay process control margins, and reduced rework.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an interconnect for an integrated circuit (IC), the method comprising:
   forming a first ILD layer over an interconnect layer, the interconnect layer including a conductive structure therein under an interconnect layer etch stop layer (ESL);
   forming an interlayer dielectric etch stop layer (ILD ESL) extending between the first interlayer dielectric (ILD) layer and a second ILD layer, wherein the ILD ESL has an etch rate that is at least five times slower than the first ILD layer and the second ILD layer; and
   forming a unitary via-wire conductive structure having a chamferless via portion thereof in the first ILD layer and a wire trench portion thereof in the second ILD layer over the first ILD layer, the unitary via-wire structure formed by:
      forming a dual damascene (DD) hard mask over the second ILD layer, wherein the DD hard mask includes a patterned wire trench hard mask layer over the second ILD layer, a mask barrier layer over the patterned wire trench hard mask layer, and a patterned via opening hard mask layer over the mask barrier layer;
      forming a patterned, mask etch stop layer (ESL) over the mask barrier layer and under the patterned via trench hard mask layer,
      etching a preliminary via opening through the second ILD layer to the ILD ESL using the DD hard mask,
      removing the ILD ESL at a bottom of the preliminary via opening, creating a via ESL opening through the ILD ESL,
      etching to form a wire trench opening in the second ILD layer and a via opening in the first ILD layer, creating a via-wire opening, wherein the via ESL opening in the ILD ESL defines the via opening in the first ILD layer as the chamferless via opening, and
      depositing a barrier liner over the via-wire opening, and depositing a conductor in the via-wire opening and planarizing to form the unitary via-wire conductive structure coupled to the conductive structure,
   wherein the chamferless via portion extends through the ILD ESL.

2. The method of claim 1, further comprising, prior to the etching the wire trench opening and the via opening, removing the mask barrier layer, exposing the patterned wire trench hard mask layer.

3. The method of claim 1, further comprising, prior to the forming the unitary via-wire conductive structure, removing any remaining interconnect layer ESL in the via opening to expose an upper surface of the conductive structure in the interconnect layer.

4. The method of claim 3, wherein the interconnect layer ESL includes a selected one of an oxygen-doped silicon carbide layer (SiC:O) and a nitrogen-doped silicon carbide (SiC:N), over an aluminum oxynitride (AlON) layer, and
   wherein the etching to form the via opening removes the selected SiC:O or SiC:N layer in a bottom of the via opening exposing the AlON layer, and the removing any remaining interconnect layer ESL removes the AlON layer in the bottom of the via opening, exposing the upper surface of the conductive structure.

5. The method of claim 1, wherein the first ILD layer includes octamethylcyclotetrasiloxane (OMCTS) 2.7, and the second ILD layer includes OMCTS 2.4.

6. The method of claim 1, wherein the ILD ESL has a thickness of less than 5 nanometers.

7. The method of claim 1, wherein the ILD ESL includes aluminum oxynitride (AlON).

8. A method of forming an interconnect of an integrated circuit (IC), the method comprising:
- forming a first interlayer dielectric (ILD) layer over an interconnect layer, the interconnect layer including a conductive structure therein under an interconnect layer etch stop layer (ESL);
- forming an aluminum oxynitride (AlON) etch stop layer (ESL) over the first ILD layer, the AlON ESL having a thickness of less than 5 nanometers;
- forming a second interlayer dielectric (ILD) layer over the AlON ESL;
- forming a dual damascene (DD) hard mask over the second ILD layer, the DD hard mask including: a patterned wire trench hard mask layer over the second ILD layer, a mask barrier layer over the patterned wire trench hard mask layer, and a patterned via opening hard mask layer over the mask barrier layer;
- etching a preliminary via opening through the mask barrier layer, the patterned hard mask layer and the second ILD layer to the AlON ESL;
- removing the AlON ESL at a bottom of the preliminary via opening, creating a via ESL opening in the AlON ESL;
- removing the mask barrier layer, exposing the patterned wire trench hard mask layer;
- etching to form a wire trench opening in the second ILD layer and a via opening in the first ILD layer, wherein the via ESL opening in the AlON ESL defines the via opening in the first ILD layer as a chamferless via opening;
- removing any remaining interconnect layer ESL in the via opening to expose an upper surface of the conductive structure in the interconnect layer; and
- forming a unitary via-wire conductive structure coupled to the conductive structure in the via-wire opening.

9. The method of claim 8, further comprising forming a patterned, mask aluminum oxynitride (AlON) etch stop layer (ESL) over the mask barrier layer and under the patterned via trench hard mask layer.

10. The method of claim 8, wherein the forming the unitary via-wire conductive structure includes depositing a barrier liner over the via-wire opening, depositing a conductor in the via-wire conductive structure and planarizing.

11. The method of claim 8, wherein the interconnect layer ESL includes an oxygen-doped silicon carbide (SiC:N) layer over an aluminum oxynitride (AlON) layer, and
- wherein the etching to form the via opening removes the SiC:N layer in a bottom of the via opening exposing the AlON layer, and the removing any remaining interconnect layer ESL removes the AlON layer in the bottom of the via opening, exposing the upper surface of the conductive structure.

12. The method of claim 11, wherein the removing the AlON ESL and the removing the AlON layer of the interconnect layer ESL each include performing one of a reactive ion etch (RIE) and a wet etch.

13. The method of claim 8, wherein the mask barrier layer includes a spin-on hard mask (SOH) layer.

14. The method of claim 8, wherein the first ILD layer includes octamethylcyclotetrasiloxane (OMCTS) 2.7, and the second ILD layer includes OMCTS 2.4.

* * * * *